(12) United States Patent
Ricci et al.

(10) Patent No.: US 10,879,053 B2
(45) Date of Patent: Dec. 29, 2020

(54) TEMPERATURE CONTROLLED SUBSTRATE SUPPORT ASSEMBLY

(71) Applicant: Lam Research Corporation, Fremont, CA (US)

(72) Inventors: Anthony Ricci, Foster City, CA (US); Henry Povolny, Newark, CA (US)

(73) Assignee: Lam Research Corporation, Fremont, CA (US)

( * ) Notice: Subject to any disclaimer, the term of this patent is extended or adjusted under 35 U.S.C. 154(b) by 424 days.

(21) Appl. No.: 15/392,584

(22) Filed: Dec. 28, 2016

(65) Prior Publication Data
US 2017/0110298 A1    Apr. 20, 2017

Related U.S. Application Data

(62) Division of application No. 13/908,676, filed on Jun. 3, 2013, now abandoned.

(51) Int. Cl.
*H01L 21/67* (2006.01)
*H01L 21/687* (2006.01)
*H01J 37/32* (2006.01)
*C23C 16/46* (2006.01)
(Continued)

(52) U.S. Cl.
CPC .... *H01J 37/32724* (2013.01); *C23C 16/4586* (2013.01); *C23C 16/46* (2013.01); *C23C 16/463* (2013.01); *H01J 37/32715* (2013.01); *H01L 21/67109* (2013.01);
(Continued)

(58) Field of Classification Search
CPC ... C23C 16/4586; C23C 16/463; C23C 16/46; H01J 37/32724; H01J 37/32715; H01L 21/67109
See application file for complete search history.

(56) References Cited

U.S. PATENT DOCUMENTS

| | | |
|---|---|---|
| 3,769,550 A | 10/1973 | Lee |
| 4,340,462 A | 7/1982 | Koch |
| 4,491,496 A | 1/1985 | Laporte et al. |

(Continued)

FOREIGN PATENT DOCUMENTS

| | | |
|---|---|---|
| EP | 0807952 A2 | 11/1997 |
| JP | H0521308 A | 1/1993 |

(Continued)

OTHER PUBLICATIONS

Notice of Reasons for Refusal dated Feb. 20, 2018 corresponding to Japanese Patent Application No. 2014-114039, 5 pages.

*Primary Examiner* — Aiden Lee

(57) ABSTRACT

A baseplate for a temperature controlled substrate support assembly in a vacuum chamber includes a single cavity in an upper surface of the base plate. A cylindrical wall extends upward around an outer perimeter of the base plate to define the cavity. A cover plate arranged on the base plate above the cavity is in thermal contact with the cylindrical wall of the base plate. A plurality of thermoelectric modules is arranged within the cavity in the upper surface of the base plate in thermal contact with the cover plate and the base plate and is sealed from the vacuum chamber and maintained at atmospheric pressure. A plurality of fluid channels is arranged within the base plate below the cavity. A plurality of heat transfer pipes extends downward toward the fluid channels from an upper surface of the base plate within the cavity.

14 Claims, 10 Drawing Sheets

(51) Int. Cl.
*C23C 16/458* (2006.01)
*F25B 21/02* (2006.01)

(52) U.S. Cl.
CPC .......... *F25B 2321/0212* (2013.01); *F25B 2321/0252* (2013.01); *Y10T 29/49117* (2015.01)

(56) References Cited

U.S. PATENT DOCUMENTS

| | | | |
|---|---|---|---|
| 4,595,484 A | | 6/1986 | Giammarco et al. |
| 4,674,565 A | * | 6/1987 | Beam .................. F28D 15/046 165/104.26 |
| 4,690,793 A | | 9/1987 | Okamura et al. |
| 4,792,378 A | | 12/1988 | Rose et al. |
| 4,820,371 A | | 4/1989 | Rose |
| 4,948,458 A | | 8/1990 | Ogle |
| 4,960,488 A | | 10/1990 | Law et al. |
| 5,085,727 A | | 2/1992 | Steger |
| 5,182,059 A | | 1/1993 | Kawasaki et al. |
| 5,200,232 A | | 4/1993 | Tappan et al. |
| 5,292,399 A | | 3/1994 | Lee et al. |
| 5,366,585 A | | 11/1994 | Robertson et al. |
| 5,515,683 A | | 5/1996 | Kessler |
| 5,556,501 A | | 9/1996 | Collins et al. |
| 5,560,779 A | * | 10/1996 | Knowles .............. C23C 16/276 118/715 |
| 5,569,356 A | | 10/1996 | Lenz et al. |
| 5,589,000 A | | 12/1996 | Harms et al. |
| 5,641,375 A | | 6/1997 | Nitescu et al. |
| 5,647,911 A | * | 7/1997 | Vanell .................. C23C 16/455 118/715 |
| 5,680,013 A | | 10/1997 | Dornfest et al. |
| 5,730,803 A | | 3/1998 | Steger et al. |
| 5,740,016 A | | 4/1998 | Dhindsa |
| 5,788,799 A | | 8/1998 | Steger et al. |
| 5,798,016 A | | 8/1998 | Oehrlein et al. |
| 5,820,723 A | | 10/1998 | Benjamin et al. |
| 5,863,376 A | | 1/1999 | Wicker et al. |
| 5,874,012 A | | 2/1999 | Kanai et al. |
| 5,885,356 A | | 3/1999 | Zhao et al. |
| 5,904,778 A | | 5/1999 | Lu et al. |
| 5,951,814 A | | 9/1999 | Saito et al. |
| 5,993,594 A | | 11/1999 | Wicker et al. |
| 6,073,577 A | | 6/2000 | Lilleland et al. |
| 6,148,765 A | | 11/2000 | Lilleland et al. |
| 6,194,322 B1 | | 2/2001 | Lilleland et al. |
| 6,227,140 B1 | | 5/2001 | Kennedy et al. |
| 6,376,385 B2 | | 4/2002 | Lilleland et al. |
| 6,394,026 B1 | | 5/2002 | Wicker et al. |
| 6,408,786 B1 | | 6/2002 | Kennedy et al. |
| 6,448,538 B1 | | 9/2002 | Miyata |
| 6,474,073 B1 | | 11/2002 | Uetsuji et al. |
| 6,705,394 B1 | | 3/2004 | Moslehi et al. |
| 6,886,347 B2 | | 5/2005 | Hudson et al. |
| 6,992,306 B2 | | 1/2006 | Honda et al. |
| 7,141,763 B2 | | 11/2006 | Moroz |
| 7,161,121 B1 | | 1/2007 | Steger |
| 7,191,599 B2 | | 3/2007 | Hara |
| 7,206,184 B2 | | 4/2007 | Ennis |
| 7,212,274 B2 | | 5/2007 | Hara et al. |
| 7,475,551 B2 | | 1/2009 | Ghoshal |
| 7,525,787 B2 | | 4/2009 | Dhindsa et al. |
| 7,543,546 B2 | | 6/2009 | Shibata et al. |
| 7,718,932 B2 | | 5/2010 | Steger |
| 7,846,255 B2 | | 12/2010 | Yoneda et al. |
| 7,939,784 B2 | | 5/2011 | Steger et al. |
| 7,978,963 B2 | | 7/2011 | Shimizu et al. |
| 8,007,591 B2 | | 8/2011 | Hamelin |
| 8,063,298 B2 | | 11/2011 | Koester et al. |
| 8,110,045 B2 | | 2/2012 | Yoneda et al. |
| 8,207,476 B2 | | 6/2012 | Tsukamoto et al. |
| 8,216,468 B2 | | 7/2012 | Page et al. |
| 8,359,871 B2 | | 1/2013 | Woods et al. |
| 8,461,674 B2 | | 6/2013 | Gaff et al. |
| 2003/0164226 A1 | | 9/2003 | Kanno et al. |
| 2004/0065259 A1 | | 4/2004 | Inazumachi et al. |
| 2005/0211385 A1 | | 9/2005 | Benjamin et al. |
| 2006/0005873 A1 | | 1/2006 | Kambe et al. |
| 2006/0207750 A1 | | 9/2006 | Chang et al. |
| 2009/0071524 A1 | | 3/2009 | Son |
| 2010/0199687 A1 | | 8/2010 | Woods et al. |
| 2011/0075118 A1 | | 3/2011 | Jacobs et al. |
| 2011/0092072 A1 | | 4/2011 | Singh et al. |
| 2012/0227929 A1 | | 9/2012 | Rose et al. |
| 2013/0098068 A1 | * | 4/2013 | Takahashi .............. F25B 21/02 62/3.2 |

FOREIGN PATENT DOCUMENTS

| | | |
|---|---|---|
| JP | 06-283594 | 10/1994 |
| JP | 06-326180 | 11/1994 |
| JP | 07-335635 | 12/1995 |
| JP | 09-067685 | 3/1997 |
| JP | 09-153481 | 6/1997 |
| JP | 09-283499 | 10/1997 |
| JP | 09-289197 | 11/1997 |
| JP | 2002-353298 A | 12/2002 |
| JP | 2007257014 A | 10/2007 |
| JP | 2009-94138 A | 4/2009 |
| JP | 201154838 A | 3/2011 |
| JP | 2013102135 A | 5/2013 |
| JP | 05-267193 B2 | 8/2013 |
| KR | 2009-0028343 A | 3/2009 |
| WO | 2010053173 A1 | 5/2010 |

* cited by examiner

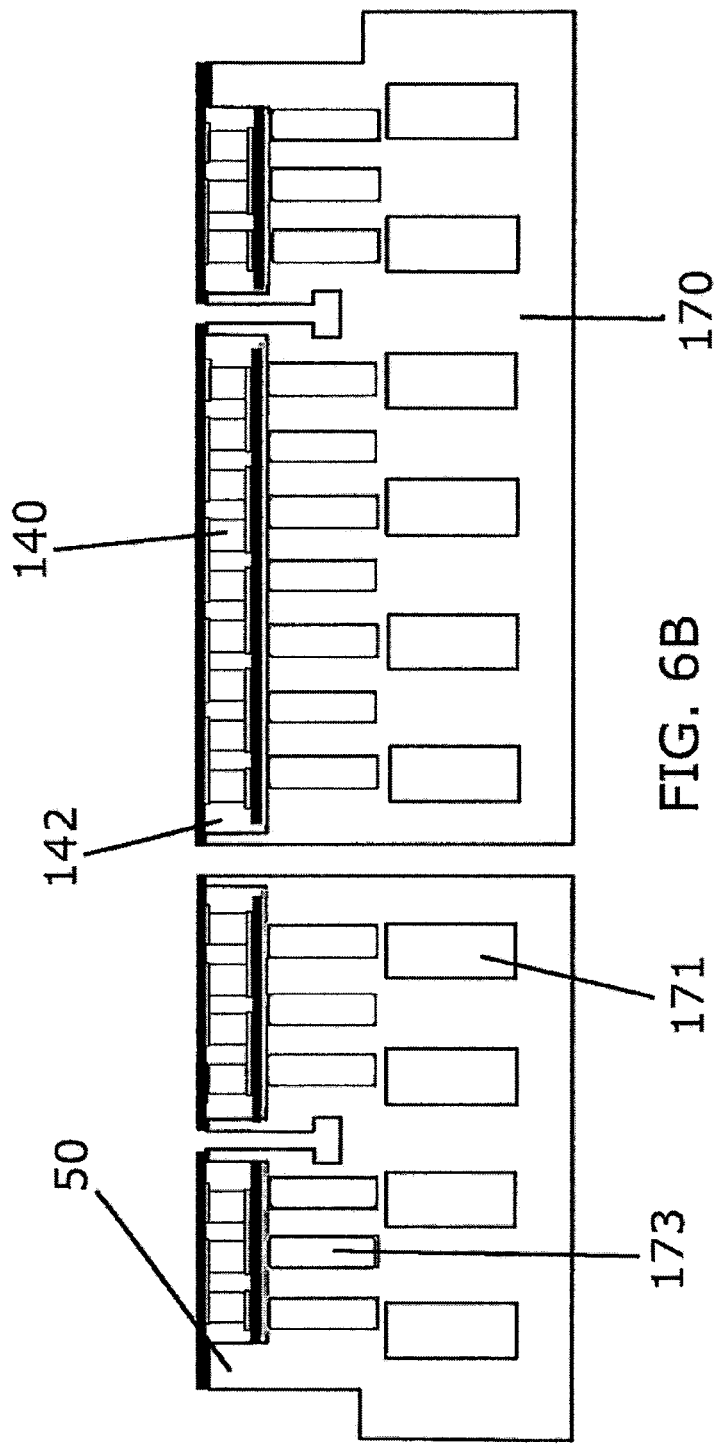

TEMPERATURE CONTROLLED SUBSTRATE SUPPORT ASSEMBLY

CROSS-REFERENCE TO RELATED APPLICATIONS

The present disclosure is a divisional of U.S. patent application Ser. No. 13/908,676 filed on Jun. 3, 2013. The entire disclosure of the application referenced above is incorporated herein by reference.

FIELD

The present invention relates to plasma processing apparatuses, and more specifically to temperature control of a substrate support assembly.

BACKGROUND

Integrated circuits are formed from a wafer or semiconductor substrate over which are formed patterned microelectronics layers. In the processing of the substrate, plasma is often employed to deposit films on the substrate or to etch intended portions of the films. Shrinking feature sizes and implementation of new materials in next generation microelectronics layers have put new requirements on plasma processing equipment. The smaller features, larger substrate size and new processing techniques require improvement in plasma processing apparatuses to control the conditions of the plasma processing.

During plasma etching, etch rates and etch rate selectivities can vary across the semiconductor substrate. Because etch rates and etch rate selectivities are influenced by temperature, there is a need for improved spatial temperature control across the substrate. In addition to improved spatial temperature control, expanding temperature ranges used to process the semiconductor substrate can allow for semiconductor substrates comprising complex material stacks to be utilized during processing.

SUMMARY

Disclosed herein is a temperature controlled substrate support assembly for processing a substrate in a vacuum chamber of a semiconductor processing apparatus. The substrate support assembly comprises a top plate for supporting the substrate. A base plate is disposed below the top plate wherein the base plate comprises a cavity in an upper surface of the base plate. A cover plate is disposed between the top plate and the base plate. At least one thermoelectric module is in the cavity in the upper surface of the base plate wherein the at least one thermoelectric module is in thermal contact with the top plate and the base plate, and the at least one thermoelectric module is maintained at atmospheric pressure.

Also disclosed herein is a method of manufacturing a substrate support assembly for controlling a temperature of a substrate during plasma processing. The method comprises bonding a lower surface of at least one thermoelectric module to a surface within a cavity in an upper surface of a base plate, bonding a lower surface of an upper electrically insulating layer included on an upper surface of the at least one thermoelectric module to a cylindrical wall defining the cavity in the upper surface of the base plate and to upwardly extending bosses within the cavity, wherein the bonded lower surface of the upper electrically insulating layer forms a vacuum seal with the cylindrical wall and the upwardly extending bosses and the cavity is open to the atmosphere through a surface of the cavity within the upper surface of the base plate, and bonding an upper surface of the upper electrically insulating layer to a cover plate.

Also disclosed herein is a method of processing a substrate in a semiconductor processing apparatus wherein the substrate is supported on a top plate of a temperature controlled substrate support assembly in a vacuum processing chamber. The method comprises a step of supplying current to at least one respective thermoelectric module in heat transfer contact with the top plate so as to control temperatures of one or more zones across the top plate. The method also comprises controlling the current to set the temperature of the top plate surface and to provide a desired temperature distribution across the substrate during processing.

BRIEF DESCRIPTION OF THE DRAWINGS

FIGS. 6A, 6B, 6C, and 6D illustrate further embodiments of a base plate which may be used in accordance with embodiments of temperature controlled substrate support assemblies disclosed herein.

DETAILED DESCRIPTION

Figure 1:
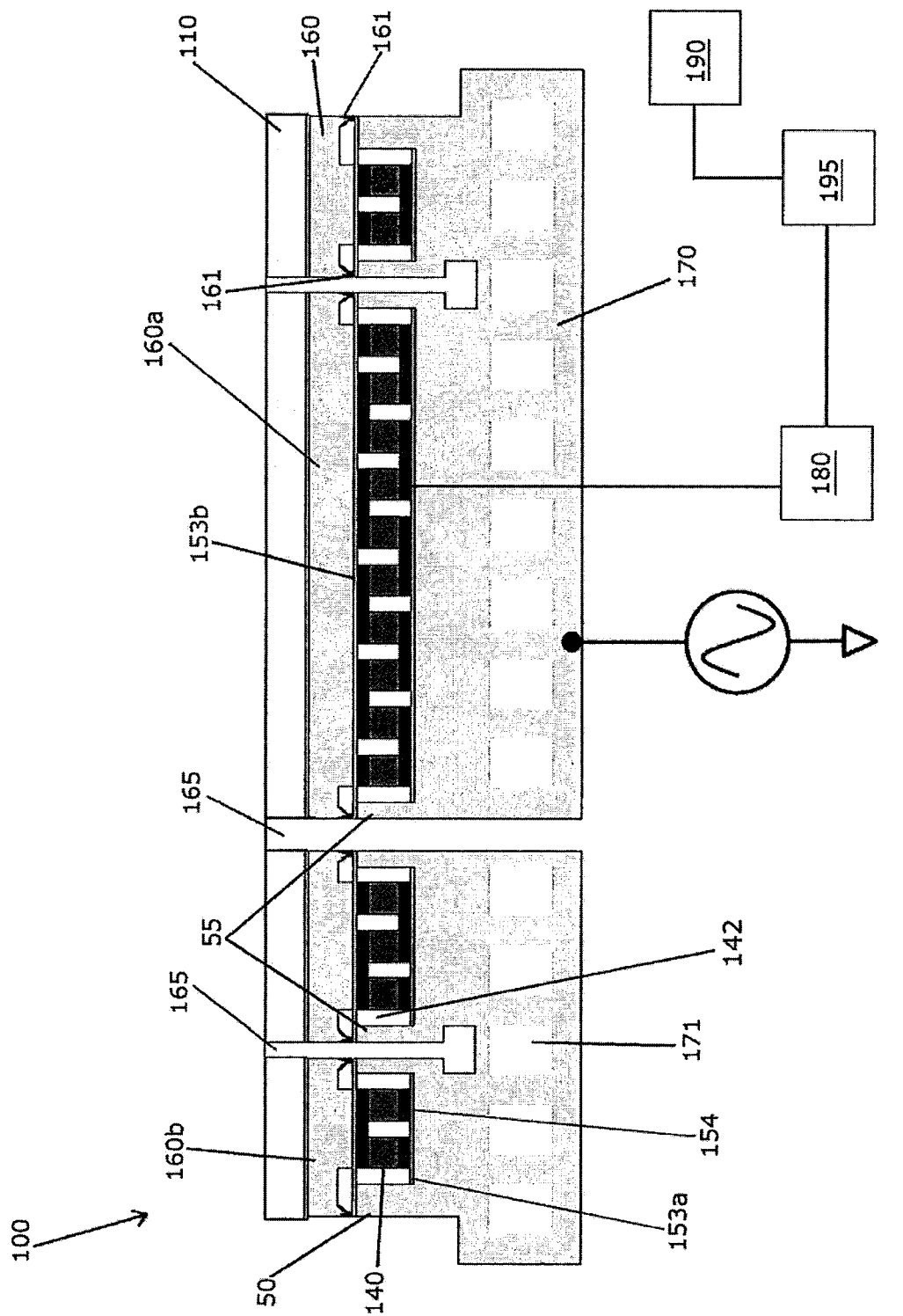
FIG. 1 illustrates an embodiment of a temperature controlled substrate support assembly comprising a plurality of thermoelectric modules.

Disclosed herein is a temperature controlled substrate support assembly ("substrate support assembly" herein), wherein the substrate support assembly comprises at least one thermoelectric module to heat and/or cool a substrate supported on a top plate (i.e. substrate support) of the substrate support assembly. In the following description, numerous specific details are set forth in order to provide a thorough understanding of present embodiments disclosed herein. It will be apparent, however, to one skilled in the art that the present embodiments may be practiced without some or all of these specific details. In other instances, well known process operations have not been described in detail in order not to unnecessarily obscure the present embodiments. Additionally, as used herein, the term "about" refers to ±10%.

Controlling the temperature of a substrate supported on a top plate comprises many variables. First, many factors can affect heat transfer, such as the locations of heat sinks in the substrate support assembly as well as the detailed structure of the various heating and cooling elements in the substrate support assembly. Second, heat transfer is a dynamic process. Therefore, unless the system in question is in heat equilibrium, heat transfer will occur and the temperature profile and heat transfer will change with time. Third, non-equilibrium phenomena, such as the plasma density profile, and the RF power profile, which are present during plasma processing, make theoretical prediction of the heat transfer behavior of any practical plasma processing apparatus difficult, hence the substrate temperature profile is often not uniform and difficult to control. These deficiencies may translate to non-uniformity in the processing rate across the whole substrate and non-uniformity in the critical dimension of the device dies on the substrate.

Further, top plates which include resistive heating elements rely on the inherent thermal resistance of the entire assembly to define the achievable range of operating temperatures. For example, substrate support assemblies which have high thermal resistance enable higher achievable temperatures because less heat is transferred to a coolant which flows through the base plate. However, substrate support assemblies which have high thermal resistance limit the minimum achievable temperatures for a given process heat load. Conversely, substrate support assemblies which have a low thermal resistance enable lower achievable temperatures for a given process heat load, but also limit the maximum achievable temperatures. To expand the operating range of the substrate support assembly, the coolant temperature can be lowered and the heating power can be increased, however, this introduces a larger thermal difference between top plate and the coolant, which exaggerates thermal non-uniformity.

To control substrate temperature, a plasma etching system can have at least one thermoelectric module arranged in the substrate support assembly, and a controller unit that controls DC current which flows through each of the thermoelectric modules arranged in the substrate support assembly. One or more thermoelectric modules can be used to expand the operating temperature range of the substrate support assembly wherein each thermoelectric module can be set to a temperature above or below the temperature of the coolant flowing through the base plate thereof. Each thermoelectric module is formed from alternating p-doped and n-doped semiconductor elements (as used herein "thermoelectric pairs"), wherein the p-doped semiconductor element and the n-doped semiconductor element are connected electrically in series and thermally in parallel by a junction. Thus, when an electrical current passes through the junction of the two semiconductor elements, it either cools or heats the junction depending on the direction of the current, thereby forming a hot side and a cool side of each thermoelectric module such that each thermoelectric module can heat or cool a respective portion of the substrate support assembly. Each thermoelectric module is preferably formed in a defined pattern, wherein each of thermoelectric modules may be arranged to so as to form a respective temperature control zone within the substrate support assembly. By tuning the power of each of thermoelectric modules under control of the controller unit, and by having an appropriate arrangement of each thermoelectric module in the substrate support assembly, a substrate may be heated or cooled and the temperature profile of a substrate during processing can be shaped concentrically, radially, and azimuthally. Additionally, the temperature gradient across the substrate support assembly can be controlled in order to maintain a desired temperature distribution across the substrate during processing by arranging each of the thermoelectric modules in the substrate support assembly. For example, a rectangular grid, a hexagonal grid, concentric circles, one or more radial arrays, or other pattern of the thermoelectric modules may be formed thereby forming temperature control zones. The substrate support assembly is operable to control the substrate temperature and consequently the plasma etching process at each device die location to maximize the yield of devices from the substrate.

During plasma processing, the vacuum chamber containing the substrate support assembly is maintained at a desired pressure such as 0 to 20 mTorr, 20 to 50 mTorr, or 50 to 300 mTorr. To prevent exposure to chemical reagents and/or undesirable glow discharge, each thermoelectric module is located in the substrate support assembly and maintained at atmospheric pressure (about 1 atm). The thermoelectric modules assembled in the substrate support assembly can provide active substrate cooling, increase temperature operating windows of the substrate support assembly, and aid in low temperature processing of substrates. The thermoelectric modules can provide greater temperature control of substrates, such as non-uniform thermal arrays or uniform thermal arrays. For example, the independently controllable thermoelectric modules assembled in the substrate support assembly can achieve about 0.1° C. uniformity across an upper surface of the substrate support assembly.

FIG. 1 illustrates a substrate support assembly 100 for a semiconductor processing system in which the substrate support assembly 100 is temperature controlled and may be used in accordance with methods and structures disclosed herein. The substrate support assembly 100 may be used for plasma processing a substrate (not shown) within a vacuum chamber in which the substrate support assembly 100 is located. The substrate is preferably supported by a top plate 110 of the substrate support assembly 100. The substrate may be, for example, a semiconductor substrate or a flat panel display. The top plate 110 may comprise an electrostatic chuck ("ESC"). The substrate support assembly 100 may also comprise an interface to a radio frequency ("RF") power source and a thermoelectric temperature control system ("thermoelectric system") formed from at least one thermoelectric module 140. The substrate may be clamped to the top plate 110 either mechanically or preferably by an ESC structure incorporated in the top plate 110. Although not illustrated, the substrate support assembly may also comprise other features such as a substrate handling system, such as lift pins and associated actuating equipment, disposed therein, conducts to deliver heat transfer gas to the backside of a substrate, temperature sensors, power lines, or the like.

The substrate support assembly 100 further includes a base plate 170 which is RF driven to provide RF bias on a substrate undergoing processing and act as a lower electrode in the plasma chamber. The base plate 170 may be formed from aluminum, copper, or other high thermal conductivity material. The base plate 170 may contain an upper surface formed from aluminum, copper, silver, pyrolytic graphite encased in aluminum, or other high thermal conductivity material upon which the thermoelectric modules are attached. The use of aluminum or pyrolytic graphite encased in aluminum permits the base plate 170 to be formed with brazing. The base plate 170 is disposed below the top plate 110 and comprises a cavity 142 in an upper surface of the base plate 170 to house the at least one thermoelectric module 140. Preferably the cavity 142 is defined by a cylindrical wall 50 which is located near an outer periphery of the base plate 170. The base plate 170 acts as a heat sink by circulating a heat transfer medium (e.g. coolant) at a constant temperature through fluid channels 171 in the base plate 170 and localized temperatures of the substrate are controlled by the at least one thermoelectric module 140. The fluid channels 171 are preferably configured for supplying a coolant or a temperature controlled gas such that the base plate 170 may act as a heat sink. For example, the base plate 170 may be cooled with a gas such as air, He, N2 or the like or liquid cooled with deionized water (DI), dielectric liquid such as Fluorinert or the like. Preferably the base plate 170 helps cut down on the power requirement to control the heat load on the upper side of the thermoelectric control system.

In a preferred embodiment more than one thermoelectric module 140 may be arranged in a single cavity 142 in the upper surface of the base plate 170 such that each thermoelectric module may form a temperature control zone within the substrate support assembly 100. The temperature control zones formed by each of thermoelectric modules 140 may be arranged into any desired configuration such as a center temperature control zone with one or more surrounding annular formations, a grid formation, a radial formation, an azimuthal formation, a polar formation, or a nonpolar formation. Preferably upwardly extending bosses 55 are located within the cavity 142 in the upper surface of the base plate 170. Thin upper and lower electrically insulating layers 153a,b are further included on an lower and upper surface of the at least one thermoelectric module 140 wherein the thermoelectric module 140 is adhered to the insulating layers 153a,b with an adhesive. The insulating layers 153a,b are preferably ceramic or flexible polyimide layers and can have a thickness of about 0.004 to 0.02 inch. The insulating layer 153a on the lower surface of the at least one thermoelectric module 140 is bonded to the upper surface of the base plate 170 within the cavity 142 with an adhesive 154, wherein the adhesive is preferably an epoxy. Alternatively, the lower surface of the at least one thermoelectric module may be bonded directly to the upper surface of the base plate 170 within the cavity 142 with solder or a low melting point alloy provided that the upper surface of the base plate 170 includes a coating of an electrically insulating material such as anodization, spray-coated aluminum oxide, Teflon®, or the like. The insulating layer 153b on the upper surface of the at least one thermoelectric module 140 is preferably bonded to a cover plate 160 with an adhesive 154, wherein the adhesive is preferably silicone. The cover plate 160 is disposed between the top plate 110 and the base plate 170. The insulating layer 153b on the upper surface of the at least one thermoelectric module 140 is also bonded to the cylindrical wall 50 defining the cavity 142 in the upper surface of the base plate 170 and the upwardly extending bosses 55 located within the cavity 142 of the base plate 170. The insulating layer 153b forms a vacuum seal with the cylindrical wall 50 and the bosses 55 of the base plate 170 such that the at least one thermoelectric module 140 is not exposed to the vacuum environment in the vacuum chamber and instead can be maintained at atmospheric pressure in the cavity 142 of the base plate 170.

The cover plate 160 is preferably formed from the same material as the base plate 170 such as aluminum, copper, pyrolytic graphite, or aluminum coated pyrolytic graphite. The cover plate 160 preferably includes downwardly extending bosses 161 wherein the bosses 161 are arranged to correspond to the upwardly extending bosses 55 located within the cavity 142. The upwardly extending bosses 55 and the downwardly extending bosses 161 have aligned openings 165 with the top plate 110 wherein the aligned openings 165 are configured to receive lift pins and/or deliver backside helium to the upper surface of the substrate support assembly 100. The upwardly extending bosses 55 and the corresponding downwardly extending bosses 161 can be arranged so as to provide RF current paths within the substrate support assembly 100 to reduce RF transmission through the thermoelectric modules 140. The downwardly extending bosses 161 are preferably chamfered such that they may minimize heat conduction between the base plate 170 and the cover plate 160 while still providing an RF current path. Additionally, the cover plate 160 may optionally act as an RF decoupling plate to electrically shield the thermoelectric modules 140 from RF voltage gradients while providing good thermal conduction between each of the thermoelectric modules 140 and the top plate 110.

During processing of a substrate, the substrate is transferred into the vacuum chamber and loaded onto the top plate. The vacuum chamber provides the process environment to perform processing such as plasma etching, deposition, or other process involved in the production of integrated chips or the like. A substrate handling system which is part of the overall substrate processing system is used to load and unload the substrate to and from the vacuum chamber. The steps of inserting, processing, and removing the substrate may be repeated sequentially for a plurality of substrates.

The thermoelectric temperature control system for controlling temperature across the top plate 110 during processing is disposed below the top plate 110 and each thermoelectric module is located in the cavity 142 within the substrate support assembly 100 wherein the cavity 142 is maintained at atmospheric pressure. The thermoelectric system preferably comprises more than one thermoelectric module 140. Each of the thermoelectric modules 140 controls temperatures across the top plate 110, thereby controlling temperatures across the substrate during processing, in response to electrical current driven by a power supply 180 through a power feedthrough in the substrate support assembly 100.

The current supply 180 may be formed of any conventional power supply. The power supply may, for example, comprise a single power source, a plurality of individual power sources, i.e. one for each thermoelectric module, or a plurality of power sources. Preferably, the power source(s) provide a direct current ("DC") wherein the DC current is electrically connected to the thermoelectric module(s) 140 via terminal(s) (not shown) which can be supported in holes 166 in the base plate 170 of the substrate support assembly 100 (see FIG. 2A). The range of current supplied by the current supply may be controlled, for example, between 0-25 amperes, depending on the heat load of the semiconductor processing system. An exemplary circuit arrangement for a thermoelectric system can be found in commonly-assigned U.S. Pat. No. 7,206,184, which is hereby incorporated in its entirety herein.

The solid state thermoelectric modules 140 control local temperatures of the substrate support assembly 100, thereby controlling the temperature distribution across the substrate during processing. For example, by controlling the power, and direction of the current to the thermoelectric modules 140, a desired temperature distribution can be established across the top plate 110 in order to provide desired processing conditions across the substrate during processing. Thus, a uniform or non-uniform temperature distribution may be maintained across the substrate during processing.

Figure 7:
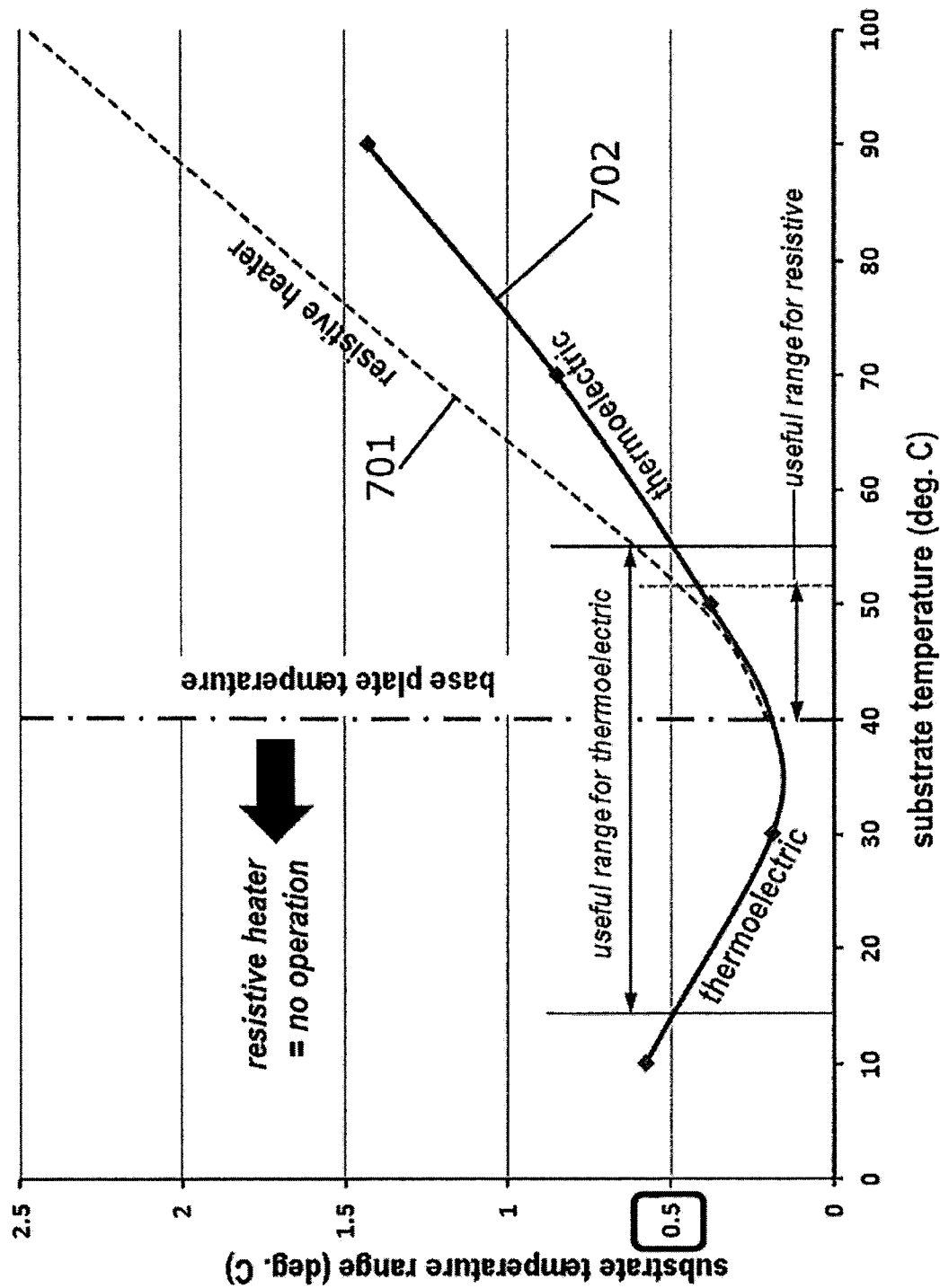
FIG. 7 illustrates a graph of the relationship between substrate temperature and substrate temperature uniformity of a substrate supported on a temperature controlled substrate support assembly in accordance with embodiments disclosed herein.

The power supply can be controlled to supply current at a sufficient level and for a period of time to achieve a desired temperature in a temperature control zone beneath the substrate. For example, the power supply can supply currents having the same value to all the thermoelectric modules in one or more temperature control zones beneath the substrate. Alternatively, the currents supplied to each of thermoelectric modules may have different values, permitting dynamic temperature control of temperature control zones beneath the substrate wherein each temperature control zone is formed by a respective thermoelectric module. For example, the current supplied to a thermoelectric module arranged under the center of the top plate 110 may be different than the current supplied to a thermoelectric module arranged in an annular zone under an outer (edge) region of the top plate 110, so that the substrate surface is heated or cooled by different amounts in the center and edge regions. This dynamic temperature control compensates for differences in temperatures of the substrate surface at the center and the edge regions due to the semiconductor processing (e.g., plasma uniformity and RF uniformity), so that a desired temperature distribution across the substrate surface may be maintained during processing. The ability of the thermoelectric modules to cool the substrate, which thereby cools the substrate surface, expands the range of processing temperatures across the substrate which can be uniformly maintained (i.e., a temperature range of 0.5° C. or less) during processing of the substrate. As the difference in temperature between the baseplate 170 and top plate 110 increases, the thermal non-uniformity across the substrate also increases. This is because heat flux, even when completely uniform, passes through layers of material included in the substrate support assembly 100 which have non-uniform thicknesses. For example, as illustrated in FIG. 7, controlling the temperature of the substrate with resistive heating elements demonstrates a linear increase in temperature non-uniformity of the substrate as the temperature of the substrate is increased, and further the resistive heating elements cannot operate at temperatures below the temperature of the base plate (line 701). Whereas, controlling the temperature with thermoelectric modules, enables operation at temperatures above and below the base plate temperature wherein temperatures across the substrate can be uniformly maintained, thereby expanding the useful temperature range of the top plate (line 702).

In this manner, the localized temperature of the top plate 110 in the vicinity of each thermoelectric module 140 can be controlled, thereby permitting the temperature on the substrate surface to be kept uniform. Because electrons may move quickly through the p-type and n-type semiconductor elements, the heating and cooling operations can be rapidly performed, providing faster response times and more uniform temperature control than substrate support assemblies utilizing gas pressure, large mass heat sinks, resistance heating plates, or the like. Additionally, due to the Peltier effect, substrates may be cooled to temperatures below the temperature of the base plate 170.

By dynamically controlling the temperature of each thermoelectric module, the substrate support assembly may be divided into multiple zones of temperature control (i.e. a multizone substrate support assembly). Such temperature control zones may be arranged such that they form concentric zones, radial zones, annular zones and/or azimuthally aligned zones.

Figure 3:
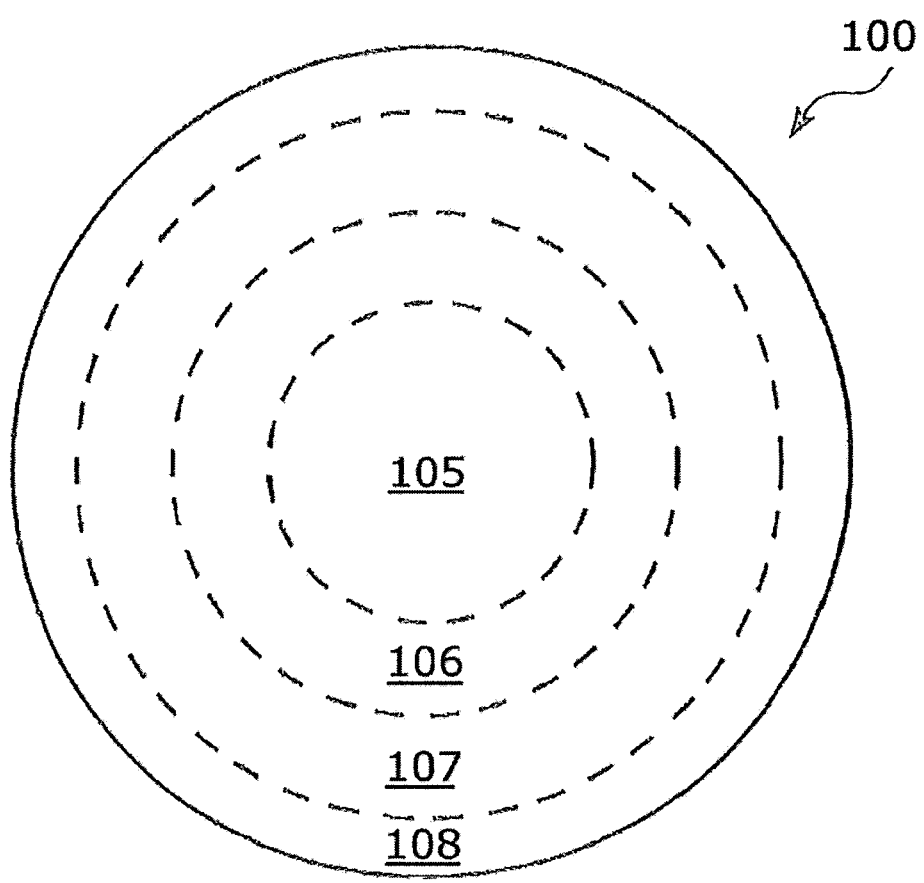
FIG. 3 illustrates an embodiment of temperature control zones which may be formed in a temperature controlled substrate support assembly disclosed herein.

Preferably the substrate support assembly 100 comprises four temperature control zones wherein three temperature control zones are concentrically arranged around a central temperature control zone. For example as illustrated in FIG. 3, a substrate support assembly 100 may be formed with four temperature control zones wherein a first center zone 105 is surrounded by three outer annular temperature zones 106, 107, 108. Alternatively it may be preferred that the substrate support assembly comprises 8 temperature control zones wherein 4 inner zones arranged in quadrants are surrounded by 4 outer zones arranged in quadrants. Examples of exemplary temperature control zone formations may be found in commonly-assigned U.S. Pat. Nos. 8,216,486, 7,718,932, and 7,161,121, which are hereby incorporated in their entirety herein.

Figure 2A:
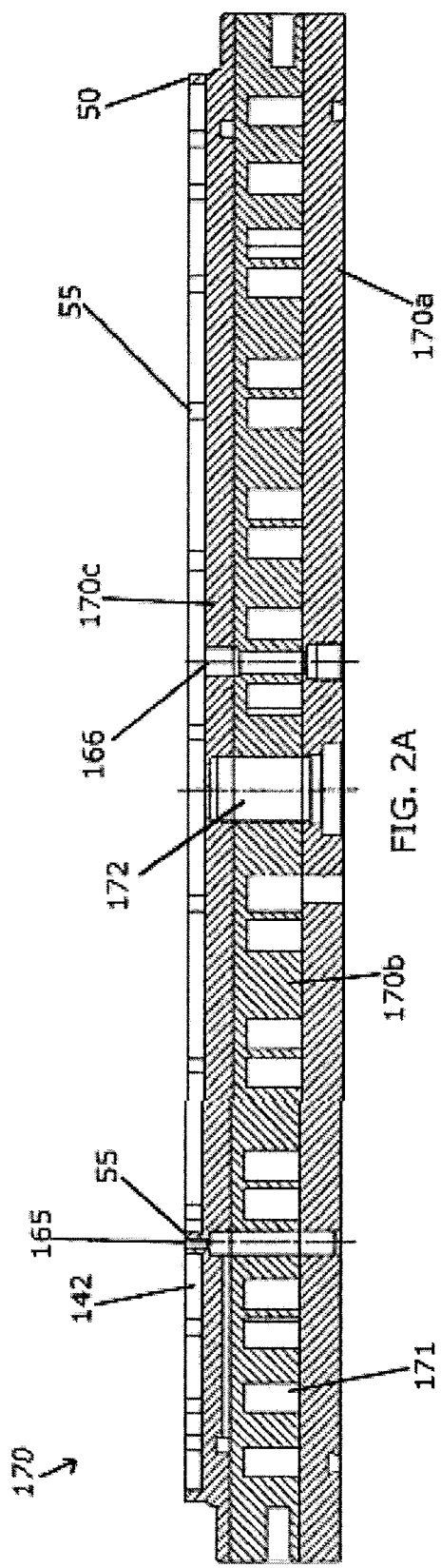
FIGS. 2A and 2B illustrate an embodiment of a base plate which may be used in accordance with embodiments of temperature controlled substrate support assemblies disclosed herein.
Figure 2B:
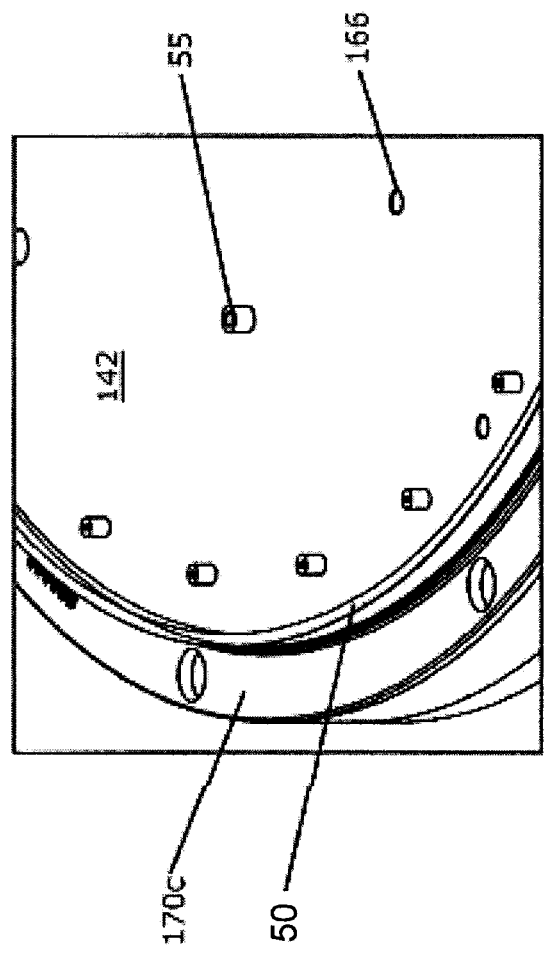

FIGS. 2A, 2B illustrate an embodiment of the base plate 170 of the substrate support assembly 100 wherein FIG. 2A illustrates a cross section of the base plate 170 and FIG. 2B illustrates a top down view of a portion the base plate 170. The base plate 170 is preferably formed from aluminum and has a central bore 172. The central bore 172 receives an RF power supply connection such that the base plate 170 can provide an RF bias on a substrate supported on the top plate 110 of the substrate support assembly 100 during processing of the substrate. Alternatively, RF power can be supplied to the cover plate 160, or to a conductive layer embedded within the top plate 110 via electrical feedthroughs suitable for carrying the necessary RF current. The base plate 170 preferably can comprise an electrically conductive support plate 170a, an electrically conductive cooling plate 170b comprising fluid channels 171 disposed above the conductive support plate 170a, and an electrically conductive thermoelectric plate 170c disposed above the cooling plate 170b. The thermoelectric plate 170c comprises a single cavity 142 wherein the cavity 142 is maintained at atmospheric pressure. The cavity 142 is preferably defined by a cylindrical wall 50 which is located near an outer periphery of the thermoelectric plate 170c. Preferably upwardly extending bosses 55 are located within the cavity 142 wherein an upper insulating layer may be supported by the upwardly extending bosses 55 and the cylindrical wall 50 forming a vacuum seal thereon. Preferably the upwardly extending bosses 55 have openings 165 configured to support lift pins and/or backside helium gas supplies. The at least one thermoelectric module 140 is arranged within the cavity 142 formed in the upper surface of the thermoelectric plate 170c wherein the cavity 142 is open to the atmosphere. Holes 166 formed in the thermoelectric plate 170c may be configured to house temperature probes or electrical feedthroughs wherein the holes 166 can expose the cavity 142 to the atmosphere such that the cavity 142 may be maintained at atmospheric pressure.

In an embodiment, the substrate support assembly 100 has a thickness of about 1.5 inches. The base plate components 170a, 170b, 170c can have a combined thickness of about 1.2 to 1.3 inches. Preferably the thermoelectric plate 170c forms a step around the outer periphery wherein the step has a height of about 0.3 inch. For processing 300 mm diameter substrates, the base plate 170 preferably has an outer diameter of about 12 to 13 inches below the step formed in the thermoelectric plate 170c and an outer diameter above the step of the thermoelectric plate 170c is less than 12 inches, preferably of about 11.7 inches. The at least one thermoelectric module (not shown) are arranged in the cavity 142 of the thermoelectric plate 170c, wherein the thermoelectric plate 170c has a thickness of about 0.3 to 0.4 inch and the cavity 142 in the upper surface of the thermoelectric plate 170c has a depth of about 0.15 inch. The cooling plate 170b preferably has a thickness of about 0.5 to 0.6 inch and the support plate 170a preferably has a thickness of about 0.3 to 0.4 inch. Preferably the cooling plate 170b and the support plate 170a each have an outer diameter of about 12.6 inches.

Referring back to FIG. 1, in a preferred embodiment, the cover plate 160 can preferably be formed from an inner cover 160a and an outer cover 160b. Preferably the cover plate 160 has a thickness of about 0.12 inch and the inner cover 160a has an outer diameter of about 9.8 inches while the outer cover 160b has an outer diameter of about 11.7 inches. The top plate 110 preferably includes at least one electrostatic clamping electrode in a layer of dielectric material and has a thickness of about 0.1 inch and a diameter of about 11.7 inches. The insulating layers 153a,b preferably have a thickness of about 0.004 to 0.02 inch, e.g., flexible polyimide layers can have a thickness of about 0.004 inch whereas ceramic layers can have a thickness of about 0.02 inch.

Figure 4:
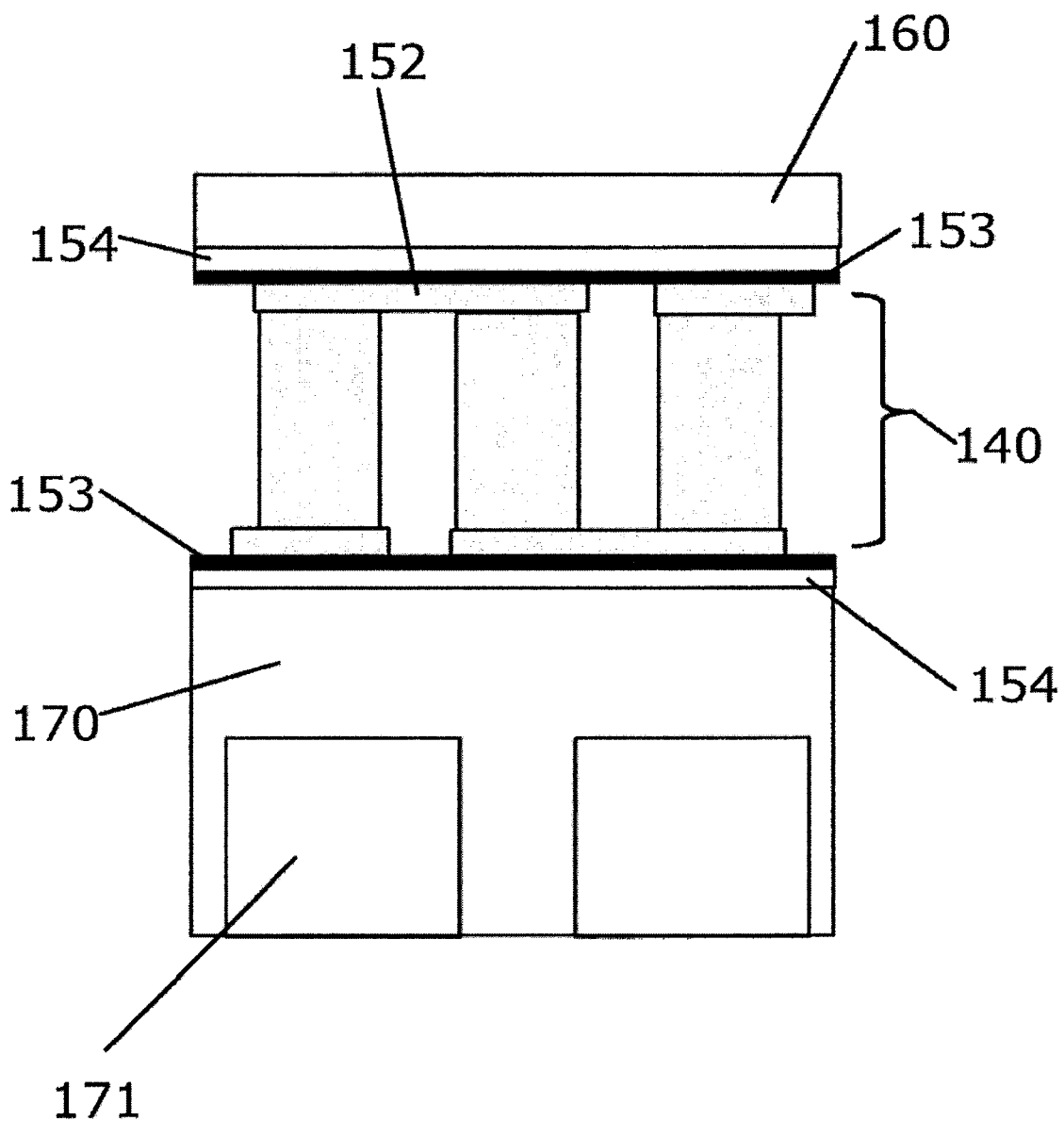
FIG. 4 illustrates a cross section of an exemplary bonding arrangement for thermoelectric modules between a base plate and a cover plate.

FIG. 4 illustrates an exemplary embodiment of a cross section of a thermoelectric module 140 (Peltier device) disposed between the base plate 170 and the cover plate 160. Preferably, the junctions 152 connecting the alternating p-type and n-type semiconductor devices of the thermoelectric module 140 are attached to an insulating layer 153a,b with an adhesive. Preferably the junctions 152 are formed from an electrically conductive material such as aluminum or copper. Preferably the insulating layers 153a,b are of a flexible polyimide material possessing characteristics such as good thermal conductivity, strength and impact resistance, creep resistance, dimensional stability, radiation resistance, and chemical resistance on upper and lower surfaces of the thermoelectric modules 140. Preferably the insulating layers 153a,b are formed from polyimide material, but alternatively the insulating layers 153a,b may be formed from a flexible polyamide material or are ceramic. Preferably the polyimide layers 153a,b provide electrical isolation and a flexible supporting surface to absorb strain on the thermoelectric modules 140 induced by temperature changes. The thermoelectric modules 140 including the insulating layers 153a,b are adhered to the base plate 170 and the cover plate 160 with adhesive layers 154. Preferably the adhesive adhering the insulating layer 153a to the base plate 170 is an epoxy, and the adhesive adhering the insulating layer 153b to the cover plate 160 is silicone. An exemplary thermoelectric module with upper and lower polyimide films is manufactured by KELK Ltd., a wholly owned subsidiary of Komatsu Ltd and can be found in U.S. Published Application No. 2013/0098068, incorporated herein by reference.

Figure 5A:
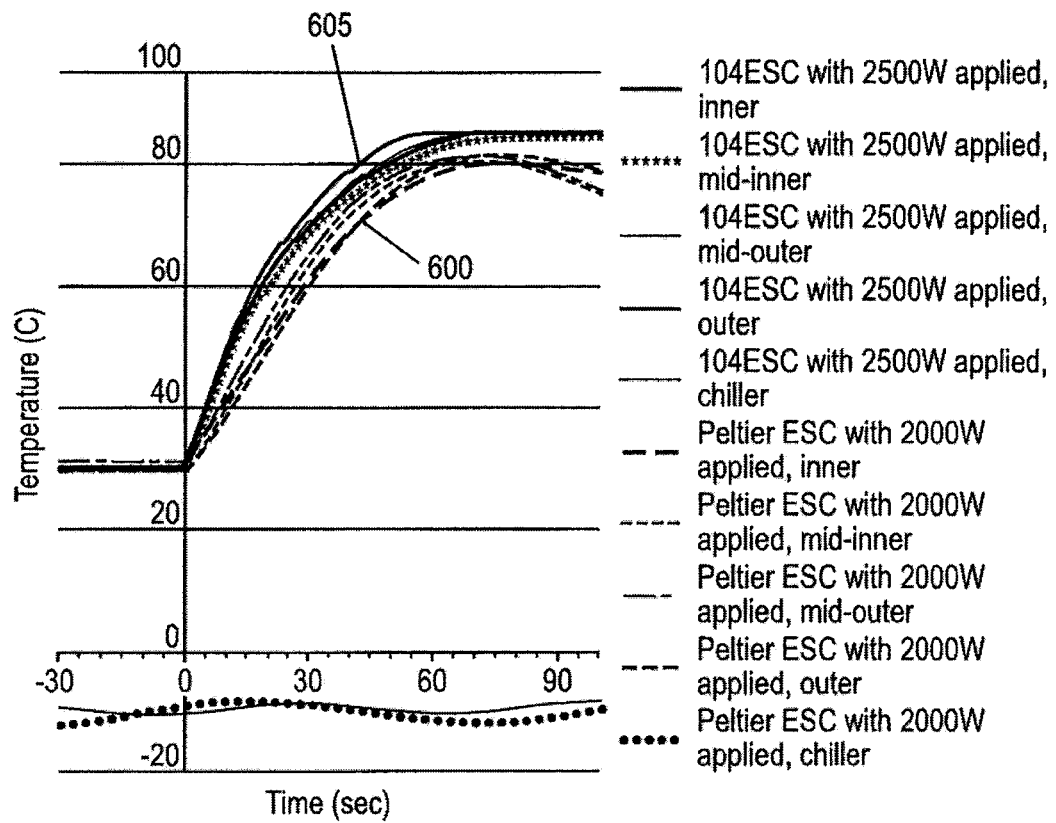
FIGS. 5A and 5B each illustrate a graph of temperature control exhibited by an embodiment disclosed herein of a temperature controlled substrate support assembly comprising a plurality of thermoelectric modules.
Figure 5B:
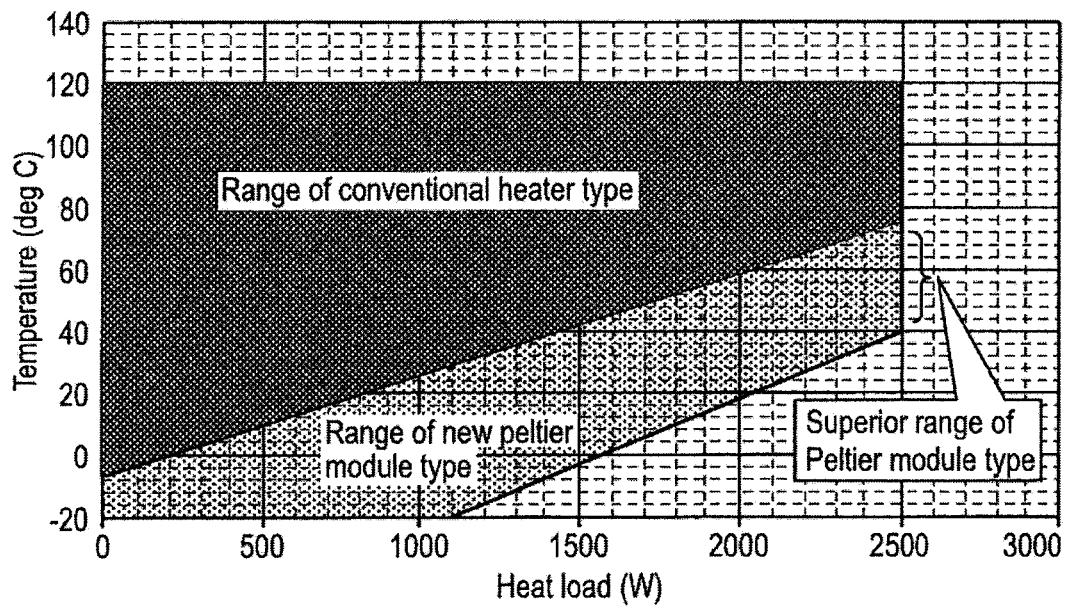

FIG. 5A illustrates a graph of temperature vs. time for a comparative multizone substrate support assembly having multizone resistance heaters over a base plate maintained at a constant temperature, represented by straight lines 605, and a multizone substrate support assembly comprising thermoelectric modules, represented by the dotted lines 600. The multizone substrate support assembly comprising thermoelectric modules can achieve similar results with a power of 2000 W in each temperature zone as the comparative multizone substrate support assembly with a power of 2500 W. For example, the multizone substrate support assembly comprising thermoelectric modules can increase the temperature of the support surface and in turn the substrate from about 30° C. to about 80° C. in about 60 seconds. Furthermore, the substrate support assembly comprising the thermoelectric modules can have a temperature transition rate of about 1.3° C. per second and can reach a maximum temperature of about 90° C. Additionally the substrate support assembly comprising the thermoelectric modules can achieve greater cooling temperature ranges. For example, as illustrated in FIG. 5B the cooling function of the substrate support assembly comprising the thermoelectric modules can maintain temperatures of about −20° C. with about a 1000 W heat load (the base plate maintained at about −10° C.) and can maintain temperatures of about 40° C. with a 2500 W heat load. In contrast, the comparative substrate support assembly operates at about 20° C. with 1000 W heat load and about 70° C. with a 2500 W heat load.

Referring back to FIG. 1, the at least one thermoelectric module 140 is arranged in the cavity 142 in the upper surface of the base plate 170, and is enclosed within the cavity 142 of the base plate 170 by the cover plate 160 wherein an insulating layer 153b bonded to the cover plate 160 forms a vacuum seal with the base plate 170. Preferably at least four thermoelectric modules are in the cavity 142 of the base plate 170 wherein the at least four thermoelectric modules are arranged so as to form four temperature control zones in the substrate support assembly 100. For example, a first thermoelectric module can be arranged to form a respective first circular zone, a second thermoelectric module can be arranged to form a respective second annular zone, a third thermoelectric module can be arranged to form a respective third annular zone, and a fourth thermoelectric module can be arranged to form a respective fourth annular zone.

Maintaining the at least one thermoelectric module in the internal space between the base plate 170 and the cover plate 160 of the substrate support assembly 100 at atmospheric pressure may reduce the risk for parasitic plasma discharge and arcing since the vertical and horizontal dimensions of the physical gaps between thermoelectric pairs are ideal for glow discharge at the operating pressures of plasma processing. In addition maintaining the cavity containing the thermoelectric modules at atmospheric pressure may reduce operating costs due to additional pumping facilities required to evacuate the chamber pressure during operation of the plasma processing apparatus. However, maintaining the thermoelectric module cavities at atmospheric pressure while the vacuum chamber of the plasma processing chamber is operating may lead to bowing of the cover plate 160, thereby bowing the top plate 110. Therefore, the cover plate 160 is preferably thick enough to account for the pressure differentials found in the vacuum chamber atmosphere and the internal space of the substrate support assembly 100. Preferably the cover plate 160 has a thickness of about 0.5 to 4 mm. In some embodiments it is preferred that the cover plate 160 be separated into two pieces, an inner cover plate 160a and an outer annular cover ring 160b, such that strain due to thermal expansion and contraction may be reduced on the underlying substrate support assembly 100 elements such as the at least one thermoelectric module 140.

The orientation of the thermoelectric modules and the number of thermoelectric modules in the substrate support assembly 100 can be selected to achieve the desired temperature distribution across the substrate. For example, for processing a substrate from which a large number of small device dies are desired, a greater number of thermoelectric modules can be used to achieve a highly uniform temperature across the temperature control zones created by the thermoelectric modules. The number of thermoelectric modules may, for example, be in the range of from 1 to 1000, or even greater as substrate sizes increase. Preferably the semiconductor elements which make up the at least one thermoelectric module 140 have a height of about 2.5 to 4.5 mm, more preferably about 3.0 to 3.5 mm, and the spacing between the p-type and n-type semiconductor elements are in the range of about 1.0 to 2.0 millimeters, more preferably about 1.5 mm.

Figure 6A:
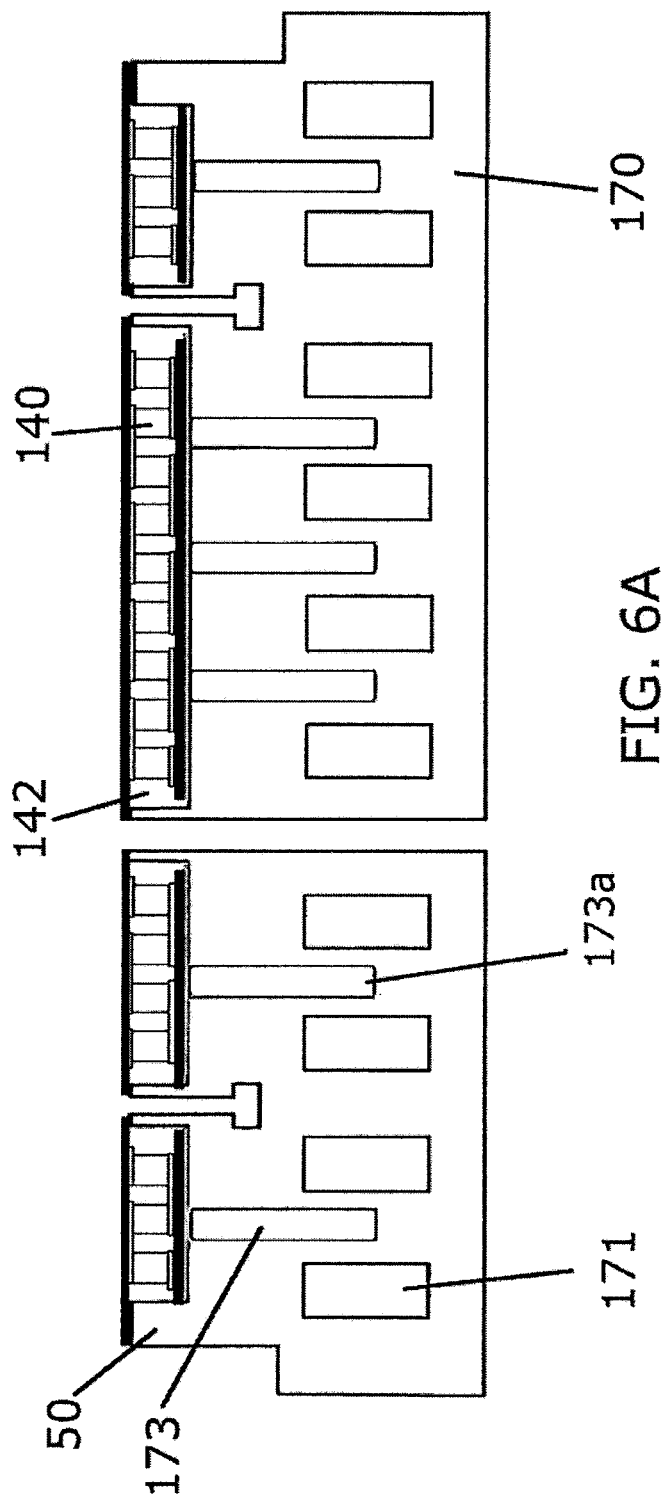

FIG. 6A, B illustrate further embodiments of a base plate 170 of a temperature controlled substrate support assembly 100. The base plate 170 may be formed from aluminum, copper, pyrolytic graphite encased in aluminum, or other high thermal conductivity material, and comprises a single cavity 142 in an upper surface of the base plate 170 to house the at least one thermoelectric module 140. Preferably the cavity 142 is defined by a cylindrical wall 50 which is located near an outer periphery of the base plate 170. The base plate 170 acts as a heat sink by circulating a heat transfer medium at a constant temperature through fluid channels 171 in the base plate 170 and localized temperatures of the substrate are controlled by the at least one thermoelectric module 140. The fluid channels 171 are preferably configured for supplying a coolant or a temperature controlled gas such that the base plate 170 may act as a heat sink. For example, the base plate 170 may be cooled with a gas such as air, He, N2 or the like or liquid cooled with deionized water (DI), dielectric liquid such as FLUORINERT® or the like.

In an embodiment, the base plate 170 includes heat transfer pipes 173, wherein vertical holes may be drilled into the lower surface of the cavity 142 and heat transfer pipes 173 may be inserted such that an upper surface of each heat transfer pipe 173 is flush with the upper surface of the base plate 170 within the cavity 142. An exemplary heat transfer pipe that can be used is a tubular heat-pipe, which is commercially available from CRS Engineering Limited of Hadston, United Kingdom. The heat transfer pipes 173 can be used to increase thermal conduction between the at least one thermoelectric module in the cavity 142 and the fluid channels 171 of the base plate 170, thereby improving the cooling capacity of the substrate support assembly 100. The heat transfer pipes 173 are preferably formed from a metal such as stainless steel or high purity copper with or without a plain copper surface finish or plating of tin, nickel, brass, silver, chromium or gold, and have an outer diameter of about 1 to 12 mm, and preferably an outer diameter of about 1 to 3 mm. The heat transfer pipes 173 have a length of about 7 to 20 mm and more preferably a length of about 10 to 15 mm. Each heat transfer pipe 173 operates with an antigravity wicking system wherein a liquid is evaporated at a first end of the tube, condenses back to a liquid at the second end of the tube, and returns to the first end via capillary action in a porous lining. Each heat transfer pipe 173 is mounted in the base plate with a condensation side at a lower end thereof and an evaporation side at an upper end thereof. The evaporation and condensation of the fluid within the heat transfer pipes 173 operates via capillary action to overcome the gravitational tendency of the fluid which increases the thermal conduction between the at least one thermoelectric module in the upper surface of the base plate 170 and the fluid channels 171. The fluid can be water or the like when the base plate 170 is operating at ambient temperatures, or the fluid can be ammonia, ethanol, or the like when the base plate 170 is operating at temperatures at less than about 0° C. Details of a heat transfer pipe can be found in U.S. Published Application No. 2006/0207750, which is incorporated by reference herein. Preferably the base plate 170 includes an array of the heat transfer pipes 173 wherein the number and arrangement of heat transfer pipes are based upon the individual cooling capacity of each heat transfer pipe 173. As illustrated in FIG. 6A, the heat transfer pipes 173 are disposed between fluid channels 171 wherein each condensation side 173a of the heat transfer pipes 173 is located at about the midpoint of each fluid channel 171. In an alternate embodiment as illustrated in FIG. 6B, the heat transfer pipes 173 are disposed above the fluid channels 171. Preferably the base plate 170 helps cut down on the power requirement to control the heat load on the upper side of the thermoelectric control system.

Figure 6C:
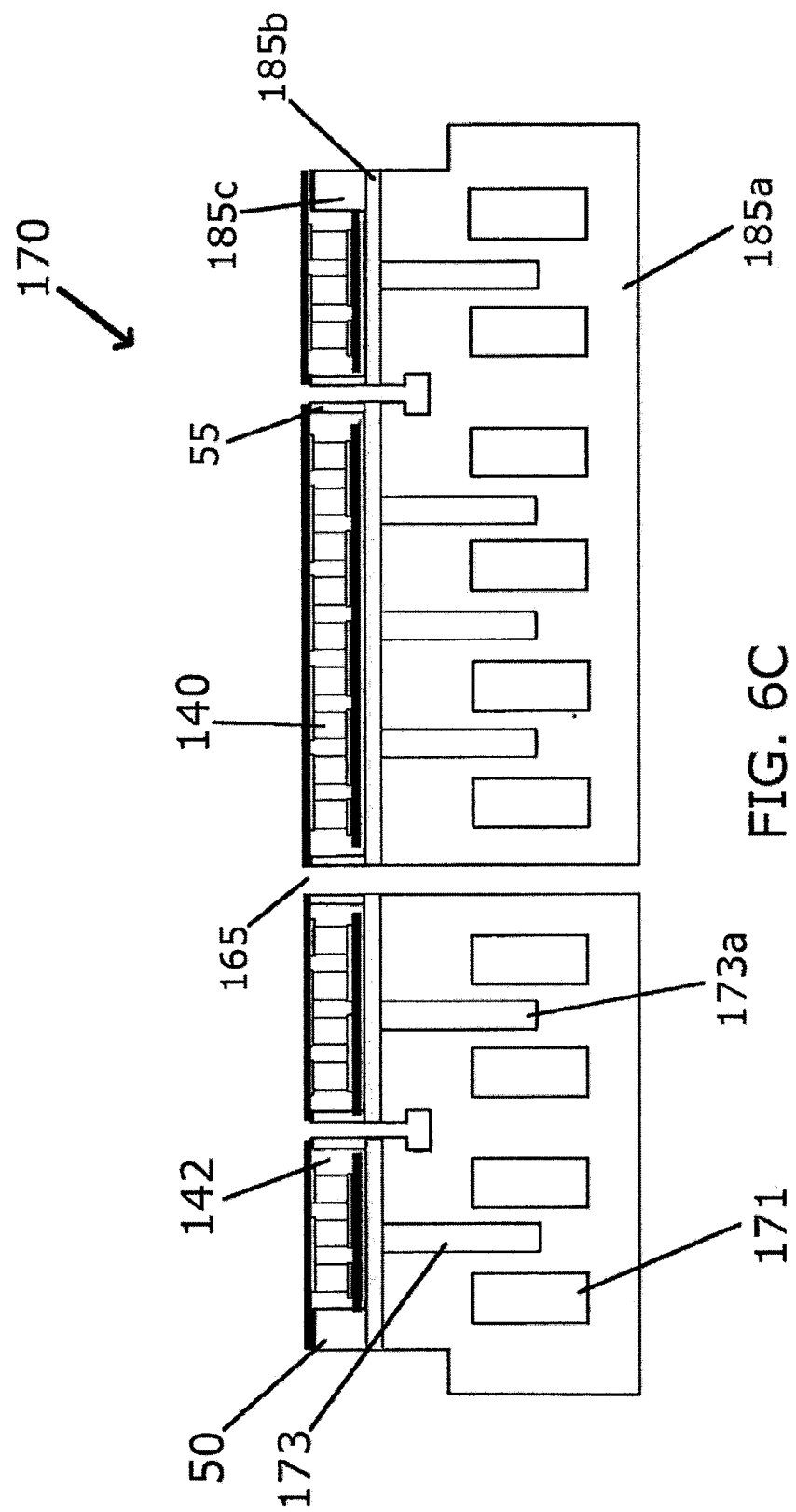

FIG. 6C illustrates a further embodiment of a base plate 170 of a temperature controlled substrate support assembly 100. The base plate 170 preferably can comprise an electrically conductive cooling plate 185a comprising fluid channels 171 and heat transfer pipes 173 wherein an upper surface of each heat transfer pipe 173 is flush with an upper surface of the cooling plate 185a. An electrically conductive heat transfer plate 185b is disposed above the electrically conductive cooling plate 185a, and an electrically conductive thermoelectric plate 185c is disposed above the heat transfer plate 185b. The electrically conductive heat transfer plate 185b is preferably formed of aluminum or a like material and configured to uniformly distribute heat between the cooling plate 185a and the thermoelectric plate 185c. The thermoelectric plate 185c comprises a single cavity 142 wherein the cavity 142 is maintained at atmospheric pressure. The cavity 142 is preferably defined by a cylindrical wall 50 which is located near an outer periphery of the thermoelectric plate 185c. Preferably upwardly extending bosses 55 are located within the cavity 142 wherein an upper insulating layer may be supported by the upwardly extending bosses 55 and the cylindrical wall 50 forming a vacuum seal thereon. Preferably the upwardly extending bosses 55 have openings 165 configured to support lift pins and/or backside helium gas supplies. The at least one thermoelectric module 140 is arranged within the cavity 142 formed in the upper surface of the thermoelectric plate 185c wherein the cavity 142 is open to the atmosphere via openings in a bottom of the plate 185c.

Figure 6D:
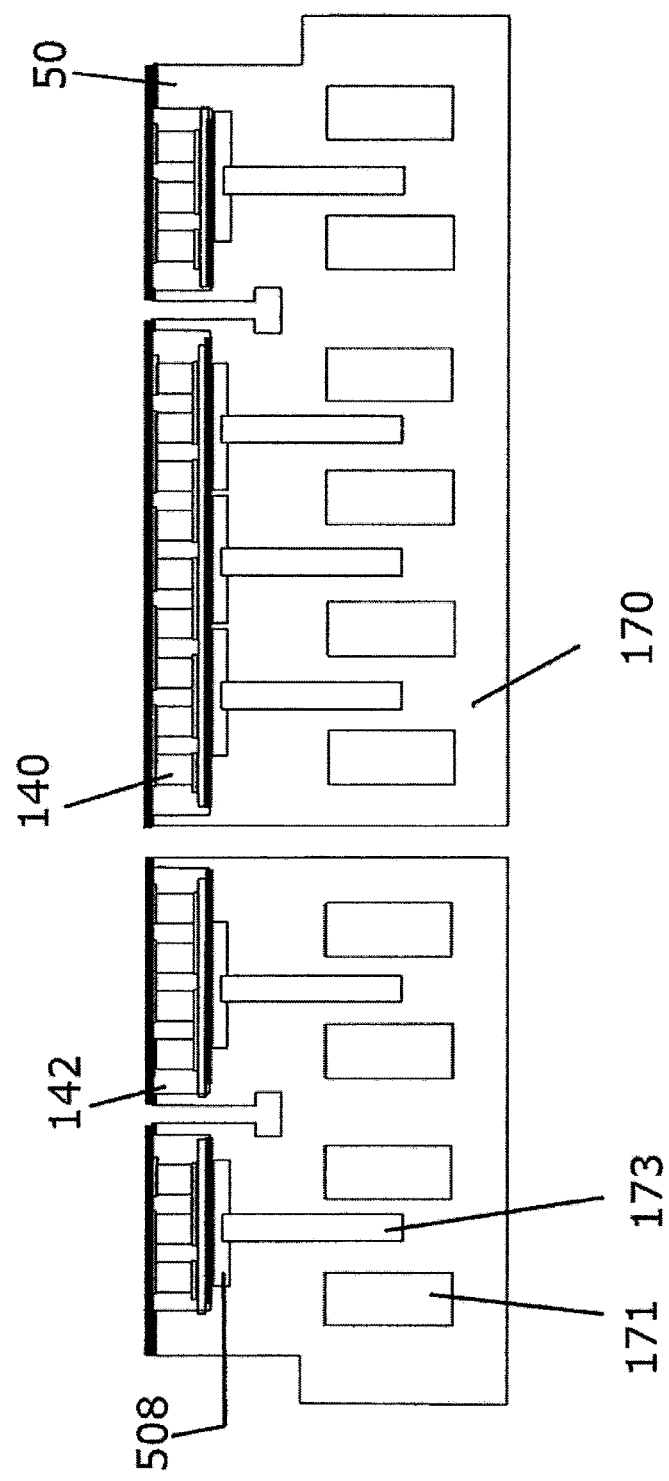

FIG. 6D illustrates a further embodiment of a base plate 170 of a temperature controlled substrate support assembly 100 wherein the base plate 170 includes heat transfer pipes 173. The base plate 170 comprises a single cavity 142 in an upper surface thereof to house the thermoelectric modules 140 wherein the cavity 142 is defined by a cylindrical wall 50 which is located near an outer periphery of the base plate 170. A heat transfer sheet 508 is located on a lower surface of the cavity 142. Each evaporation side of each heat transfer pipe 173 is attached to the heat transfer sheet 508 wherein the heat transfer sheet 508 expands the effective surface area of each heat transfer pipe 173 thereby increasing heat transfer between the thermoelectric modules 140 and the fluid channels 171. The heat transfer sheet 508 has high thermal conductivity and is preferably formed from aluminum, copper, pyrolytic graphite, or aluminum coated pyrolytic graphite. In an embodiment, the heat transfer sheet 508 may be segmented, such that each segment of the heat transfer sheet 508 is attached to a respective heat transfer pipe 173, or alternatively, each segment of the heat transfer sheet 508 is attached to a group of respective heat transfer pipes 173.

A controller 195 may be used to control the currents supplied by the current supply 180. The controller may control the currents based on statistical data concerning the temperature distribution of a substrate. In this case, the controller controls the current supply to supply constant currents that are set in advance. Alternatively, the controller may control the currents in response to sensed temperature information obtained during processing of a substrate. The sensed temperature information may be obtained, from a sensor 190 such as one or more thermocouples or an infrared (IR) camera. The sensors 190 sense the temperature across the substrate surface during processing. Based on the sensed temperature information, the controller 195 adjusts the direction and power of currents supplied to the thermoelectric modules 140 by the current supply, thus providing real time substrate temperature control.

Further disclosed herein is a method of processing a substrate in a semiconductor processing apparatus wherein the substrate is supported on a top plate of a temperature controlled substrate support assembly in a vacuum processing chamber. The method comprises controlling temperatures of respective portions of the top plate by supplying current to at least one thermoelectric module in heat transfer contact with the top plate while processing the substrate. Preferably, the process comprises plasma etching the substrate. The method also comprises controlling the current to control the temperature of the top plate surface and to provide a desired temperature distribution across the substrate.

It will be appreciated by those of ordinary skill in the art that the present invention can be embodied in other specific forms without departing from the spirit or essential characteristics thereof. The presently disclosed embodiments are therefore considered in all respects to be illustrative, and not restrictive. The scope of the invention is indicated by the appended claims, rather than the foregoing description, and all changes that come within the meaning and range of equivalence thereof are intended to be embraced therein.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A base plate for a temperature controlled substrate support assembly in a vacuum chamber, the base plate comprising:
    an upper surface;
    a single cavity in the upper surface of the base plate;
    a cylindrical wall extending upward around an outer perimeter of the base plate to define the cavity;
    a cover plate arranged on the base plate above the cavity, wherein the cover plate is in thermal contact with the cylindrical wall of the base plate;
    a plurality of thermoelectric modules arranged within the cavity in the upper surface of the base plate, wherein each of the plurality of thermoelectric modules is in thermal contact with the cover plate and the base plate, and wherein the cavity and the plurality of thermoelectric modules are sealed from the vacuum chamber and maintained at atmospheric pressure;
    a plurality of fluid channels arranged within the base plate below the cavity; and
    a plurality of heat transfer pipes extending downward toward the fluid channels from an upper surface of the base plate within the cavity.

2. The base plate of claim 1, wherein the plurality of heat transfer pipes is configured to increase a thermal conductance between the plurality of thermoelectric modules and the plurality of fluid channels.

3. The base plate of claim 1, further comprising a heat transfer plate, wherein the heat transfer plate is arranged above the plurality of heat transfer pipes and below the plurality of thermoelectric modules.

4. The base plate of claim 3, wherein the heat transfer plate is arranged between and in thermal contact with a lower plate of the base plate and the cylindrical wall.

5. The base plate of claim 3, wherein the heat transfer plate comprises copper.

6. The base plate of claim 1, further comprising a heat transfer sheet arranged in the cavity between the plurality of thermoelectric modules and the upper surface of the base plate.

7. The base plate of claim 6, wherein the heat transfer sheet is in thermal contact with the plurality of heat transfer pipes.

8. The base plate of claim 6, wherein the heat transfer sheet includes a plurality of segments, and wherein each of the segments is in thermal contact with at least one of the plurality of heat transfer pipes.

9. The base plate of claim 6, wherein the heat transfer sheet comprises at least one of copper, aluminum, pyrolytic graphite, and aluminum coated pyrolytic graphite.

10. The base plate of claim 1, wherein the plurality of heat transfer pipes comprises at least one of stainless steel, copper, tin, nickel, brass, silver, chromium, and gold.

11. The base plate of claim 1, wherein each of the plurality of heat transfer pipes is configured to (i) contain a liquid, (ii) evaporate the liquid at an upper end of the heat transfer pipe adjacent to the cavity, (iii) cause condensation of the evaporated liquid at a lower end of the heat transfer pipe, and (iv) return the liquid to the upper end of the heat transfer pipe.

12. The base plate of claim 11, wherein the liquid comprises at least one of ammonia and ethanol.

13. The base plate of claim 1, wherein each of the plurality of heat transfer pipes extends downward between adjacent ones of the plurality of fluid channels.

14. The base plate of claim 1, wherein lower ends of each of the plurality of heat transfer pipes terminates above the plurality of fluid channels.

* * * * *